US007622789B2

United States Patent
Brederlow (10) Patent No.: US 7,622,789 B2
(45) Date of Patent: Nov. 24, 2009

(54) POLYMER TRANSISTOR ARRANGEMENT, INTEGRATED CIRCUIT ARRANGEMENT AND METHOD FOR PRODUCING A POLYMER TRANSISTOR ARRANGEMENT

(75) Inventor: Ralf Brederlow, Munich (DE)

(73) Assignee: Infineon Technologies AG (DE)

( * ) Notice: Subject to any disclaimer, the term of this patent is extended or adjusted under 35 U.S.C. 154(b) by 1287 days.

(21) Appl. No.: 10/714,536

(22) Filed: Nov. 13, 2003

(65) Prior Publication Data

US 2004/0209394 A1    Oct. 21, 2004

(51) Int. Cl.
*H01L 35/24* (2006.01)
(52) U.S. Cl. .................... 257/577; 257/40; 257/288; 257/E21.005; 257/E51.006; 257/E51.027; 438/99
(58) Field of Classification Search .............. 438/99; 257/40, E51.005, E51.006, E51.027, 288, 257/577
See application file for complete search history.

(56) References Cited

U.S. PATENT DOCUMENTS

| | | | | |
|---|---|---|---|---|
| 5,596,208 A * | 1/1997 | Dodabalapur et al. | ......... | 257/66 |
| 5,796,121 A * | 8/1998 | Gates | ......... | 257/59 |
| 5,912,473 A * | 6/1999 | Wakita et al. | ......... | 257/40 |
| 5,981,970 A * | 11/1999 | Dimitrakopoulos et al. | ... | 257/40 |
| 6,150,668 A * | 11/2000 | Bao et al. | ......... | 257/40 |
| 6,455,873 B1 | 9/2002 | Lonergan | | |
| 6,720,572 B1 * | 4/2004 | Jackson et al. | ......... | 257/40 |
| 2003/0218166 A1 * | 11/2003 | Tsutsui | ......... | 257/40 |
| 2004/0012018 A1 * | 1/2004 | Tanabe | ......... | 257/40 |
| 2004/0191952 A1 * | 9/2004 | Shtein et al. | ......... | 438/99 |
| 2004/0222412 A1 * | 11/2004 | Bai et al. | ......... | 257/40 |

FOREIGN PATENT DOCUMENTS

WO    WO-01/01452 A2    1/2001

OTHER PUBLICATIONS

C.D. Dimitrakopoulos, et al.; "Organic thin-film transistors: A review of recent advances"; IBM J. Res. & Dev., vol. 45 No. 1, Jan. 2001; pp. 11-27.
P.V. Necliudov, et al.; "Modeling of organic thin film transistors of different designs"; Journal of Applied Physics, vol. 88, No. 11, Dec. 1, 2000, pp. 6594-6597.
D. Nuhrmann; "Das grosse Werkbuch Elektronik ist 20 Jahre alt", vol. 2, 1998, Franzis 'Verlag Poing, ISBN 3 7723-6547-7, pp. 1415-1423.
U. Tietze, C. Schenk "Halbeiterschaltungstechnik", Springer-Verlag, Berlin, 1993, pp. 555-560.
Howard E. Katz, et al.; "Organic field-effect transistors with polarizable gate insulators"; Journal of Applied Physics, vol. 91, No. 3, Feb. 1, 2002; pp. 1572-1576.

* cited by examiner

*Primary Examiner*—Matthew C Landau
*Assistant Examiner*—Colleen E Snow
(74) *Attorney, Agent, or Firm*—Dickstein, Shapiro, LLP.

(57) ABSTRACT

The invention relates to a polymer transistor arrangement, an integrated circuit arrangement and a method for producing a polymer transistor arrangement. The polymer transistor arrangement contains a polymer transistor formed in and/or on a substrate. The polymer transistor contains a first source/drain region, a second source/drain region, a channel region between the first and second source/drain regions, a gate region and a gate-insulating layer between channel region and gate region. A drive circuit of the polymer transistor arrangement is set up in such a way that it provides the source/drain regions and the gate region with electrical potentials such that the junction between at least one of the source/drain regions and the channel region can be operated as a diode.

12 Claims, 4 Drawing Sheets

FIG 9

POLYMER TRANSISTOR ARRANGEMENT, INTEGRATED CIRCUIT ARRANGEMENT AND METHOD FOR PRODUCING A POLYMER TRANSISTOR ARRANGEMENT

FIELD OF THE INVENTION

The invention relates to a polymer transistor arrangement, an integrated circuit arrangement and a method for producing a polymer transistor arrangement.

BACKGROUND OF THE INVENTION

In order to produce electrical circuits which can process analog signals, so-called absolute reference voltage sources are often required. U. Tietze, C. Schenk "Halbleiterschaltungstechnik" ["Semiconductor circuitry"], Springer-Verlag, Berlin, 1993, pp. 555-560, discloses using diodes as electrical components for reference voltage sources.

An important area in modern electronics is so-called polymer electronics, in which polymer materials are used as a material for forming electrical circuits or circuit components. C. D. Dimitrakopoulos, D. J. Mascaro (2001) "Organic thin film transistors", IBM J. Res. & Dev. 45, pp. 11-27, provides an overview of organic thin film transistors based on polymer materials.

Problems arise if a reference voltage source is intended to be formed in the context of polymer electronics, since to date there is no satisfactory technical solution for diodes in the context of a simple polymer technology.

Consequently, no reference voltage circuits comparable to CMOS or bipolar or general silicon circuitry are known in polymer electronics.

The possibilities known from the prior art for generating reference voltages cannot be applied to polymer transistor technology (apart from simple voltage dividers relating to a supply voltage) since, in said technology, there are a priori no pn junctions as a basis for diodes or bipolar transistors. However, a diode is usually required for a sufficiently accurate reference voltage source in silicon technology.

P. V. Necliudov, M. S. Shur, D. J. Gundlach, T. N. Jackson (2000) "Modeling of organic thin film transistors of different designs" J. Appl. Phys. 88, pp. 6594-6597, discloses organic light emitters with altered charge carrier injection.

U.S. Pat. No. 6,455,873 B1 discloses a microelectronic device with a conductive polymer.

Nührmann, D "Das große Werkbuch Elektronik" ["The large workbook of electronics"], Volume 2, 1998, Franzis' Verlag Poing, ISBN 3-7723-6547-7, pages 1415-1423, discloses temperature-compensated reference diodes.

SUMMARY OF THE INVENTION

Consequently, the invention is based on the problem of providing a diode-like component for the field of polymer electronics with a low outlay.

The problem is solved by means of a polymer transistor arrangement, by means of an integrated circuit arrangement and by means of a method for producing a polymer transistor arrangement having the features in accordance with the independent patent claims.

The polymer transistor arrangement according to the invention has a polymer transistor formed in and/or on a substrate. The polymer transistor contains a first source/drain region, a second source/drain region, a channel region between the first and second source/drain regions and also a gate region. The polymer transistor furthermore contains a gate-insulating layer between channel region and gate region. The polymer transistor arrangement furthermore has a drive circuit which is set up in such a way that it provides the source/drain regions and the gate region with electrical potentials such that the junction between at least one of the source/drain regions and the channel region can be operated as a diode.

Furthermore, the invention provides an integrated circuit arrangement having at least one polymer transistor arrangement having the features described.

In accordance with the invention's method for producing a polymer transistor arrangement, a polymer transistor is formed in and/or on a substrate by a first source/drain region being formed, a second source/drain region being formed and a channel region being formed between the first and second source/drain regions. Furthermore, a gate region is formed. A gate-insulating layer is furthermore formed between channel region and gate region. Furthermore, a drive circuit of the polymer transistor arrangement according to the invention is formed and set up in such a way that it provides the source/drain regions and the gate region with electrical potentials such that the junction between at least one of the source/drain regions and the channel region is operated as a diode.

A fundamental idea of the invention is based on connecting up a junction between one of the source/drain regions of a polymer transistor and the channel region in such a way that it can be used as a diode. A suitable operating point is chosen for this by applying to the source/drain regions and the gate region corresponding electrical potentials at which one of the source/drain regions can be used as a diode. Consequently, the invention makes it possible to have a diode as an integrated circuit component in the field of polymer electronics, too. Furthermore, said diode need not be formed as a separate component, but rather may be concomitantly used as a junction between a source/drain region and the channel region.

Using such a diode, the invention also makes it possible to realize a reference voltage circuit in polymer electronics.

In the case of polymer transistors as are described in C. D. Dimitrakopoulos et al., for example, the junction between a source/drain region and an electrically semiconducting channel region is produced by means of a Schottky junction, see P. V. Necliudov et al. A Schottky diode is a diode which, instead of a pn junction, uses a metal-semiconductor contact or a metal-polymer contact, the metal having a different work function than the other material that is contact-connected. A metal-polymer contact may be regarded as a diode since it has a behavior which has a rectifying functionality with regard to an applied electrical signal.

In the case of a polymer transistor, such a Schottky diode is connected in series with the actual field-effect transistor both on the side of the first source/drain region and on the side of the second source/drain region. However, such a diode cannot be contact-connected on both sides since the polymer material forming the channel region of the polymer transistor is not electrically accessible without a further Schottky junction. The Schottky diode as is necessarily produced at the contact points between source/drain regions and channel region of the polymer transistor on account of the technological boundary conditions can be controlled at suitable operating points of the transistor by application of a suitable gate voltage in such a way that it dominates or critically influences the electrical behavior of the transistor. Given the choice of a suitable operating point, only one of the two Schottky junctions is determinant for the current flow. The small-signal resistance of the transistor and of the other Schottky diode (in a boundary region between the other source/drain region and the channel region) are then small compared with the non-reactive resistance of the current-determining Schottky diode (between the first source/drain region and the channel region).

Given the choice of a gate voltage of a sufficiently large magnitude and a drain voltage of a sufficiently small magnitude, principally the reverse-biased Schottky junction is determinant for the current flow. The current flowing through it rises approximately exponentially with the applied drain voltage and is therefore suitable as a replacement for a zener diode or a bipolar transistor. The term zener diode denotes a diode which is designed for operation in the breakdown region of the characteristic curve. Zener diodes are often used for voltage stabilization purposes.

Consequently, according to the invention, circuits having at least one diode as are known for silicon technology can be applied to polymer technology. A pn diode used as a voltage reference is replaced by a polymer transistor operated with a gate voltage of a sufficiently large magnitude and a drain voltage of a sufficiently small magnitude, so that said polymer transistor has properties similar or identical to those of a Schottky diode. The reference character of the silicon band gap energy in a pn diode is thus clearly replaced by the difference in work functions between metal and polymer.

According to the invention, a polymer transistor is clearly connected up in such a way that the junction between one of the source/drain regions and the channel region is set up or can be operated as a diode. The polymer transistor is clearly connected up in such a way that it represents a gate-controlled diode.

It should be noted that both the polymer transistor and the drive circuit may be formed completely in polymer technology.

Preferred developments of the invention emerge from the dependent claims.

The drive circuit may be set up in such a way that it applies electrical potentials to the source/drain regions and to the gate region such that the junction between one of the two source/drain regions and the channel region is connected as a reverse-biased diode. In this case, the junction between the other of the two source/drain regions and the channel region is connected as a forward-biased diode. The reverse-biased diode is then dominant for the non-reactive resistance of the polymer transistor arrangement.

The value of the electrical potentials applied to the source/drain regions for the purpose of controlling the diode may be chosen on the basis of the thickness and/or the value of the dielectric constant of the gate-insulating layer of the polymer transistor. The value of the gate voltage may also be set on the basis of these or other criteria. Preferably, the value (in terms of magnitude) of the gate voltage is chosen to be essentially proportional to the value of the dielectric constant of the gate-insulating layer.

A metallic or a polymer material may be used as material of the source/drain regions of the polymer transistor arrangement. A polymer material is preferably used for the channel region. When using a first polymer material for the source/drain regions and a second polymer material for the channel region, the junction between the first and second polymer materials may be used as a pn junction, as an ip junction or as an in junction. If a metallic material is used as material for the source/drain regions and a polymer material for the channel region, then a Schottky junction is present. Generally, the substrate and the source/drain regions may be produced from a material such that the junction between one of the source/drain regions and the channel region is a Schottky junction, a pn junction, an in junction or an ip junction.

The drive circuit may be set up in such a way that the magnitude of the gate voltage is greater than the magnitude of the voltage between the source/drain regions. Preferably, the drive circuit may be set up in such a way that the magnitude of the gate voltage provided is significantly greater than the magnitude of the voltage between the source/drain regions. It is further preferable for the magnitude of the gate voltage to be greater than the magnitude of the voltage between the source/drain regions at least by approximately one order of magnitude.

In the case of the polymer transistor arrangement, the junctions between a respective one of the source/drain regions and the channel region may be formed geometrically asymmetrically with respect to one another. By means of this measure, it is clearly possible to realize the junctions mentioned with different structural and hence different physical properties. As a result, it is possible technologically to support the different driving of the two diodes by application of electrical potentials to the terminals of the polymer transistor. Consequently, the two junctions may be formed structurally differently for example in such a way that an electrical driving of one of the junctions as a diode is thereby facilitated or made more difficult.

For this purpose, one of the source/drain regions may be formed at least partially on the organic semiconductor and the other source/drain region may be formed at least partially below the organic semiconductor. In this case, a significantly better conductivity results with the contact arranged above the organic semiconductor, so that the diode junction at the other contact dominates the current flow.

The integrated circuit arrangement according to the invention, which has at least one polymer transistor arrangement according to the invention, is described in more detail below. Refinements of the integrated circuit arrangement also apply to the polymer transistor arrangement, and vice-versa.

The integrated circuit arrangement may be set up as a reference voltage circuit, preferably as a temperature-compensated reference voltage circuit.

The integrated circuit arrangement may also be set up as a current source.

Furthermore, the integrated circuit arrangement may be set up as a voltage control circuit.

The integrated circuit arrangement may also be set up as a combination of the circuit types mentioned. For example, the integrated circuit arrangement according to the invention may have a current source with a first polymer transistor arrangement and a reference voltage source with a second polymer transistor arrangement.

Furthermore, apart from the polymer transistor or transistors, other components of the integrated circuit according to the invention may also be produced from polymer material. By way of example, an operational amplifier may likewise be formed in polymer electronics.

BRIEF DESCRIPTION OF THE DRAWINGS

Exemplary embodiments are illustrated in the figures and are explained in more detail below.

DETAILED DESCRIPTION OF THE PREFERRED MODE OF THE INVENTION

Identical or similar components in different figures are provided with the same reference numerals.

A polymer transistor arrangement 100 in accordance with one exemplary embodiment of the invention is described below with reference to FIG. 1.

The polymer transistor arrangement 100 has a polymer transistor formed on a substrate 101. Said polymer transistor contains a gate region 106 made of titanium material, which is formed on the substrate 101. A PVP layer (polyvinylphenol) is formed as gate-insulating layer 105 on the gate region 106. The gate-insulating layer 105 is formed by means of the application of PVP material and by means of the photolithographic patterning of the layer of PVP material, as a result of which the gate-insulating layer 105 remains. A first source/drain region 102 made of gold material is formed on one part of the substrate 101 and on one part of the gate-insulating layer 105. A second source/drain region 103 made of gold material is formed on another part of the substrate 101 and on another part of the gate-insulating layer 105. Furthermore, an active pentacene layer is formed on both source/drain regions 102, 103 and on a region of the gate-insulating layer 105 that is arranged between said source/drain regions, the central section of which pentacene layer serves as channel region 104. It should be noted that pentacene is an organic semiconducting material. At least some of the components of the polymer transistor may be printed on. By means of a drive circuit 107, which is electrically coupled to the two source/drain regions 102, 103 and to the gate region 106 by means of electrically conductive coupling means 108, the source/drain regions 102, 103 and the gate region 106 are in each case provided with an electrical potential such that the junction between one of the source/drain regions 102 or 103 and the channel region 104 can be operated as a diode.

The gate-insulating layer 105 may alternatively be produced from silicon oxide (e.g., generated by means of thermal oxidation of silicon material), aluminum oxide or PVP (polyvinylphenol). The gate region 106 may alternatively also be produced from palladium or gold. Examples of polymer materials which can be used for forming the polymer transistor according to the invention or other circuit components are primarily recurring chains of carbon-containing molecules. For example, it is possible to use pentacene, poly(3-hexylthiophene), organic-inorganic hybrids such as $(C_6H_5C_2H_4NH_3)_2SnI_4$, $C_{60}$ or αω-dihexylquinquethiophene (DHα5T).

An equivalent circuit diagram 200 of the polymer transistor connected up according to the invention is described below with reference to FIG. 2.

Figure 1:
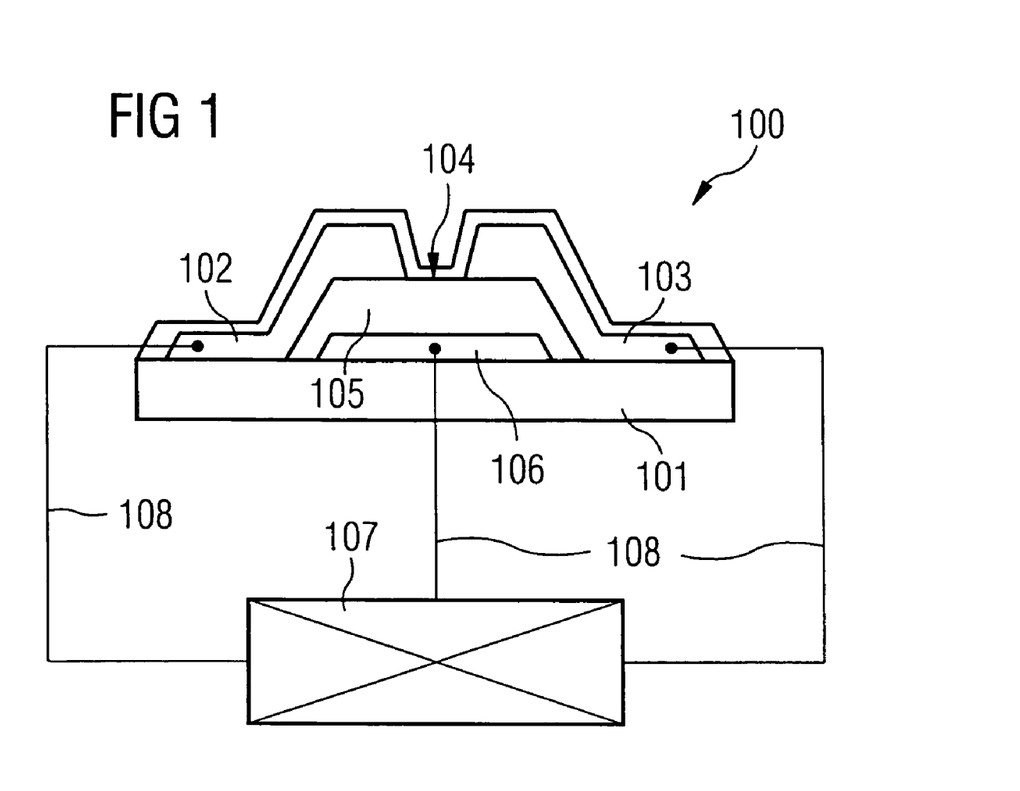
FIG. 1 shows a polymer transistor arrangement in accordance with an exemplary embodiment of the invention.

The equivalent circuit diagram 200 shows the components from FIG. 1 and also a first diode 201 as a circuitry equivalent of the junction between the first source/drain region 102 and the channel region 104 and also a second diode 202 as a circuitry equivalent of the junction between the channel region 104 and the second source/drain region 103. The diagram further depicts first and second non-reactive resistors 203, 204 for modeling contact effects in FIG. 2, which are arranged between a respective one of the source/drain regions 102, 103, on the one hand, and a respective terminal of a respective diode 201, 202, on the other hand.

Figure 2:
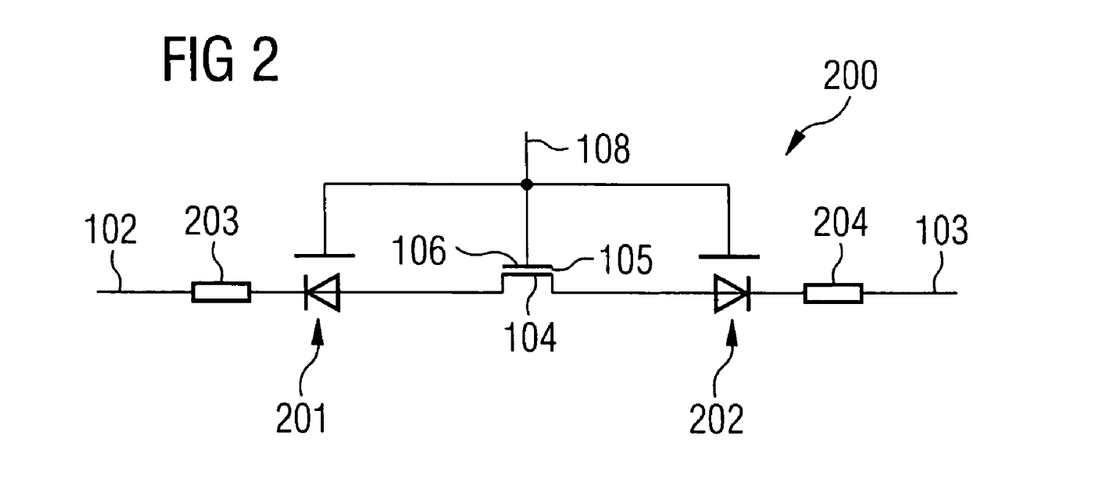
FIG. 2 shows an equivalent circuit of a polymer transistor arrangement according to the invention.

It is clearly the case that, according to the invention, the operating point of the polymer transistor arrangement 100 is set by application of suitable electrical voltages, which are applied to the terminals 102, 103, 106 by means of the drive circuit 107 in such a way that only one of the two diodes 201, 202 shown in FIG. 2 functions as a diode in circuitry terms, whereas the other of the two diodes has a very low impedance. As an alternative, it is also possible for both diodes 201, 202 to be operated as diodes. FIG. 2 diagrammatically indicates that the diodes 201, 202 are also influenced by means of an electrical potential applied to the gate region 106.

If the voltage drop across the diode 201 is designated as $V_{d1}$, the voltage drop across the diode 202 is designated as $V_{d2}$, the voltage drop across the channel region 104 is designated as $V_i$, the voltage between the first source/drain region 102 and the gate region 106 is designated as $V_{gs}$, the voltage between the second source/drain region 103 and the gate region 106 is designated as $V_{gd}$, and the voltage between the source/drain regions 102, 103 is designated as $V_{ds}$, then the voltages should fulfill the following relationships in terms of magnitude:

$V_{gs} > V_{gd} \gg V_{ds}$; $V_{d1} > V_{d2} \gg V_i$

In this case, primarily the first diode 201 functions as a diode also in circuitry terms.

A description is given below, with reference to the diagram 300 from FIG. 3, of how the operating point of the polymer transistor arrangement 100 is chosen in order to operate one of the two junctions between one of the two source/drain regions 102, 103, on the one hand, and the channel region 104, on the other hand, as a diode.

In the diagram 300, the electrical voltage between the two source/drain regions 102, 103 is plotted along an abscissa 301. The electric current at the second source/drain terminal 103 is plotted along an ordinate 302. Furthermore, FIG. 3 shows first to third characteristic curves 303 to 305, the first characteristic curve 303 corresponding to a voltage between the gate region 105 and the first source/drain region 102 of 0 volts, the second characteristic curve 304 corresponding to a voltage of −5 volts and the third characteristic curve 305 corresponding to a voltage of −10 volts.

Figure 3:
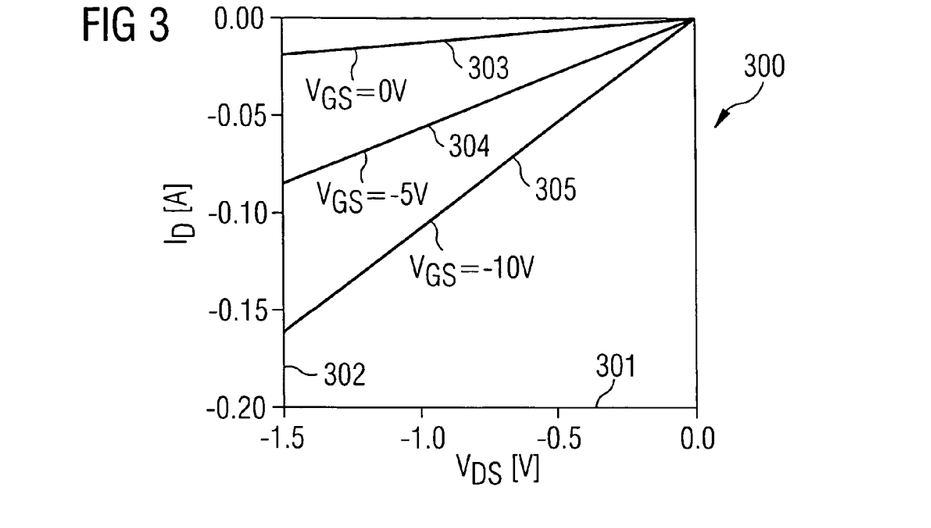
FIG. 3 shows a diagram showing the dependence of the drain current on the source/drain voltage of a polymer transistor according to the invention.

In the example shown in FIG. 3, the operating points which correspond to the third characteristic curve 305 are well suited to operating the polymer transistor arrangement 100 in such a way that one of the two diodes 201, 202 can actually be operated as a diode. What is particularly well suited is the operating range on the third characteristic curve 305 in the region of voltages of small magnitude between the two source/drain regions 102, 103, i.e., in the top right region of the diagram 300 in accordance with FIG. 3.

At a suitable operating point, the voltage (in terms of magnitude) between the gate region 106 and the first source/drain region 102 is given by the oxide capacitance per area (the magnitude of the voltage between the gate region 106 and the first source/drain region 102 is approximately indirectly proportional thereto). Furthermore, the electrical voltage between the gate region 106 and the first source/drain region 102 should be as large as possible in terms of magnitude, that is to say as near as possible to a maximum permissible voltage. By contrast, the magnitude of the voltage between the two source/drain regions 102, 103 should be as near as possible to 0 volts. The maximum permissible voltage primarily depends on the quality (in particular on the output transconductance) of the polymer transistor. If the value of the output transconductance is small relative to the diode conductance of the Schottky junction, then the Schottky diode dominates the electric current and the transistor behaves like a diode at this operating point.

A description is given below, with reference to FIG. 4, of a reference voltage circuit 400 as an integrated circuit arrangement in accordance with a first exemplary embodiment of the invention.

In the case of the reference voltage circuit 400, an input voltage 401 Vin is applied between the electrical ground potential 402 and a first terminal of a current source 403. A reference voltage 404 Vref is present between the other terminal of the current source 403 and the electrical ground potential 402. Furthermore, the first source/drain region 102 of a polymer transistor 406 is coupled to the second terminal of the current source 403. The second source/drain region 103 of the polymer transistor 403 is at the electrical ground potential 402. The bias voltage 405 Vbias is applied to the gate region 106.

The polymer transistor 406, by application of the bias voltage Vbias, is brought to an operating point such that it operates like a Schottky diode. In accordance with the predetermined operating point, a gate voltage of large magnitude and drain voltages of small magnitude are applied to the terminals of the polymer transistor 406. In the path between the input voltage 401 Vin and the reference voltage 404 Vref, a constant electric current flows through the current source 403. If an increased electric current is tapped off at the node of the reference voltage 404 Vref, at the same time a smaller electric current flows through the polymer transistor 406, since otherwise the electrical voltage at the reference voltage 404 Vref is greatly reduced and, consequently, exponentially less current can flow through the polymer transistor 406. The setting of the bias voltage 405 Vbias is not all that sensitive with regard to the size of the electric current as long as one is in the suitable operating point range. Therefore, in many cases the input voltage 401 Vin may be provided jointly with the bias voltage 405.

Figure 4:
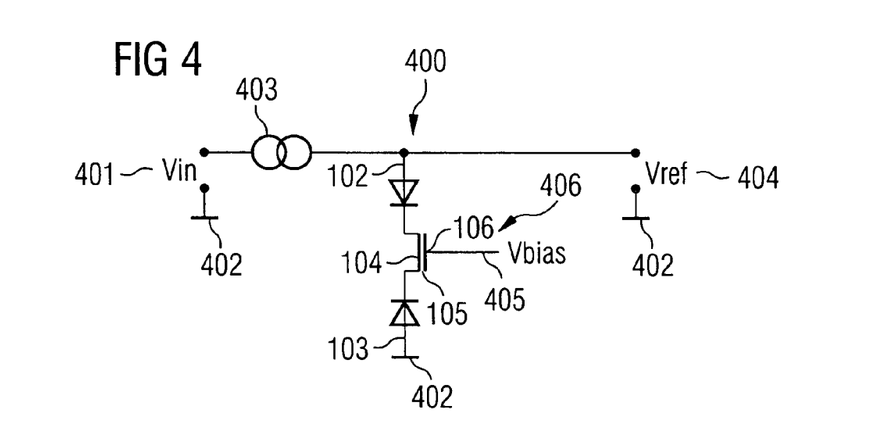
FIG. 4 shows a reference voltage circuit as an integrated circuit arrangement in accordance with a first exemplary embodiment of the invention.

It is clearly the case in the reference voltage circuit 400 shown in FIG. 4 that the diode between the channel region 104 and the second source/drain region 103 is connected as zener diode for voltage stabilization purposes. The unstabilized input voltage Vin 401 is passed via the current source 403 to the polymer transistor 406 with the lower diode in accordance with FIG. 4 as zener diode.

Figure 5:
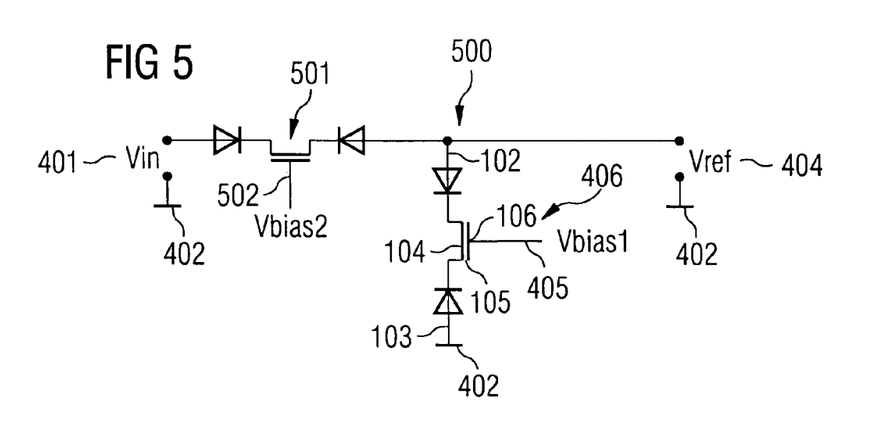
FIG. 5 shows a reference voltage circuit as an integrated circuit arrangement in accordance with a second exemplary embodiment of the invention.

A description is given below, with reference to FIG. 5, of a reference voltage circuit 500 as an integrated circuit arrangement in accordance with a second exemplary embodiment of the invention.

The reference voltage circuit 500 differs from the reference voltage circuit 400 shown in FIG. 4 essentially by the fact that another polymer transistor 501 is used as current source 403, another bias voltage 502 Vbias2 being applied to the gate terminal of said transistor. The other polymer transistor 501 is essentially constructed like the polymer transistor 406. The bias voltage 405 at the gate region 106 of the polymer transistor 406 is designated by Vbias1 (instead of Vbias) in FIG. 5.

In particular, Vbias2 is chosen in such a way that the other polymer transistor 501 is operated in saturation.

In principle, the value of the reference voltage obtained can be set by setting a number of series-connected Schottky junctions, that is to say a plurality of series-connected polymer transistors 406 in the current path between ground potential 402 and reference voltage 404. It is advantageous, in particular, in this case to provide for each of the polymer transistors in the current branch described a dedicated bias voltage at the respective gate region, in order to obtain a respectively suitable diode operating point.

It should be noted that the other polymer transistor 501 in FIG. 4 together with its connections may itself be interpreted as an integrated circuit arrangement according to the invention, set up as a current source.

Figure 6:
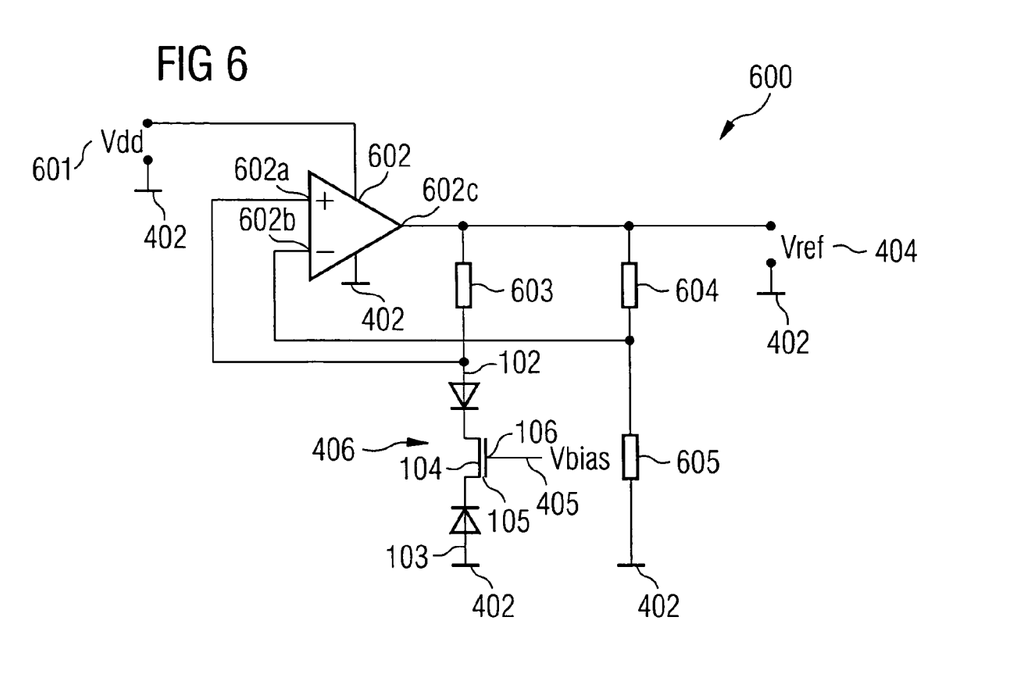
FIG. 6 shows a voltage control circuit as an integrated circuit arrangement in accordance with a third exemplary embodiment of the invention.

A description is given below, with reference to FIG. 6, of a voltage control circuit 600 as an integrated circuit arrangement in accordance with a third exemplary embodiment of the invention.

The voltage control circuit 600 has an operational amplifier 602 provided with an operating voltage 601. Furthermore, the operational amplifier 602 is provided with the ground potential 402 as lower voltage reference point. An output 602c of the operational amplifier 602 is fed back to a non-inverting input 602a of the operational amplifier 602 via a first non-reactive resistor 603. Furthermore, the output 602c is fed back to an inverting input 602b of the operational amplifier 602 via a second non-reactive resistor 604. Moreover, the output 602c is at the reference voltage 404 Vref. A third non-reactive resistor 605 is connected between the second non-reactive resistor 604 and the electrical ground potential 402. The two source/drain terminals 102, 103 of the polymer transistor 406 are connected between the first non-reactive resistor 603 and the electrical ground potential 402. The bias voltage 405 Vbias is applied to the gate terminal 106 of the polymer transistor 406.

The stabilized reference voltage Vref 404 is determined by means of the second and third non-reactive resistors 604, 605. The electric current through the polymer transistor 406 has the effect of holding the voltage Vref at a constant value, which is clearly defined by means of the kink voltage of the Schottky diode of the polymer transistor 406. Fluctuations in the operating voltage 601 Vdd are suppressed by the common-mode rejection of the operational amplifier 602.

The polymer transistor 406 in the voltage control circuit 600 again serves as a replacement for a zener diode. That Schottky diode of the polymer transistor 406 which is arranged between the channel region 104 and the second source/drain region 103 is again the diode which can be operated on the basis of the connections according to the invention.

The value of the reference voltage 404 Vref can be altered by setting the number of series-connected polymer transistors 406. For this purpose, (in a departure from FIG. 6) a plurality of polymer transistors are to be connected in series into the current branch between the non-inverting input 602a and the ground potential 402 into which the polymer transistor 406 is connected. In this case, the plurality of series-connected polymer transistors could all be operated with the same bias voltage Vbias 405.

It should be noted that the value of the first non-reactive resistor 603 can influence the size of the reference voltage Vref.

Figure 7:
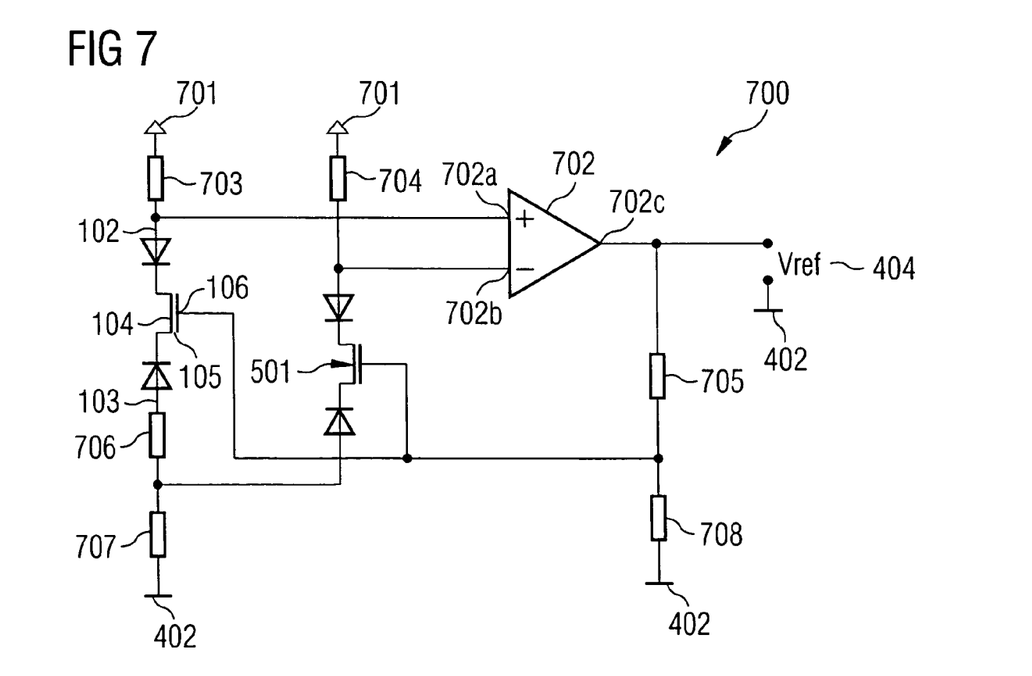
FIG. 7 shows a temperature-compensated reference voltage circuit as an integrated circuit arrangement in accordance with a fourth exemplary embodiment of the invention.

A description is given below, with reference to FIG. 7, of a temperature-compensated reference voltage circuit 700 as an integrated circuit arrangement in accordance with a fourth exemplary embodiment of the invention.

A first non-reactive resistor 703 is connected between a terminal at which a supply voltage 401 is provided and a non-inverting input 702a of an operational amplifier 702. A second non-reactive resistor 704 is connected between the supply voltage 701 and an inverting input 702b of the operational amplifier 702. An output 702c of the operational amplifier 702 is at the electrical potential of the reference voltage Vref 404. Furthermore, the output 702c is coupled to a third non-reactive resistor 705. The third non-reactive resistor 705 is coupled to the gate region 106 of the polymer transistor 406. The first source/drain region 102 of the polymer transistor 406 is coupled to the first non-reactive resistor 703. The second source/drain region 103 of the polymer transistor 406 is coupled to a fourth non-reactive resistor 706. Furthermore, a fifth non-reactive resistor 707 is connected between the fourth non-reactive resistor 706 and the electrical ground potential 402. The fourth non-reactive resistor 706 is coupled to a first source/drain region of another polymer transistor 501. The second source/drain region of the other polymer transistor 501 is coupled to the second non-reactive resistor 704 and to the inverting input 702b of the operational amplifier 702. The gate terminal of the other polymer transistor 501 is coupled to the gate terminal of the polymer transistor 406. Furthermore, a sixth non-reactive resistor 708 is connected between the gate region of the other polymer transistor 501 and the electrical ground potential 402.

Using the property of the operational amplifier 702 of subtracting from one another the electrical voltages provided at two inputs 702a, 702b, it is possible to generate the voltage reference circuit 700, which compensates in particular linear temperature gradients of the components of the circuit. In the case of the temperature-compensated reference voltage circuit 700, the first and second non-reactive resistors 703, 704 are dimensioned in such a way that the same electrical voltage is dropped across them. By means of the fourth non-reactive resistor 706, a small voltage difference is generated between the source/drain terminals of the polymer transistors 406, 501. The change in the electric current at the fifth non-reactive resistor 707 in the event of a change in temperature then depends on the dimensioning of the two transistors 406, 501 relative to one another (for example the dimensioning of the gate widths of said transistors). Since the electric currents through the two transistors 406, 501 lead to a voltage drop across the fifth non-reactive resistor 707, the temperature-dependent change thereof also leads to a corresponding voltage drop across the fifth non-reactive resistor 707. If the characteristics of the two transistors 406, 501 and of the fifth non-reactive resistor 707 are set in such a way that the change in voltage in the event of a change in the temperature is compensated for sufficiently exactly by the change in the influence of the gate voltage on the polymer transistors 406, 501, then the circuit 700 is free of a (linear) temperature response and constitutes a temperature-compensated voltage source. The gate voltage at the polymer transistors 406, 501 is furthermore to be set in such a way that the two polymer transistors 406, 501 have a sufficiently large voltage difference in terms of magnitude between the respective gate terminal and one of the two source/drain terminals and the current through the polymer transistors 501, 406 leads to only a small voltage drop.

A description is given below, with reference to FIG. 8, of a polymer transistor 800 of a polymer transistor arrangement according to the invention in accordance with a preferred exemplary embodiment of the invention.

The polymer transistor 800 has a substrate 101 with a first and a second surface region, a metallic gate region 106 being applied on the first surface region. A first source/drain region 102 made of gold material is applied on the second surface region. A gate-insulating layer 105 is formed on the gate region. Furthermore, a channel region 104 made of a semiconducting polymer is formed on a surface region of the layer sequence thus obtained, which channel region 104 covers both the gate region 106 covered with the gate-insulating layer 105 and the first source/drain region 102. A second source/drain region 103 made of gold material is formed partially on the substrate 101 and partially on the channel region 104.

Figure 8:
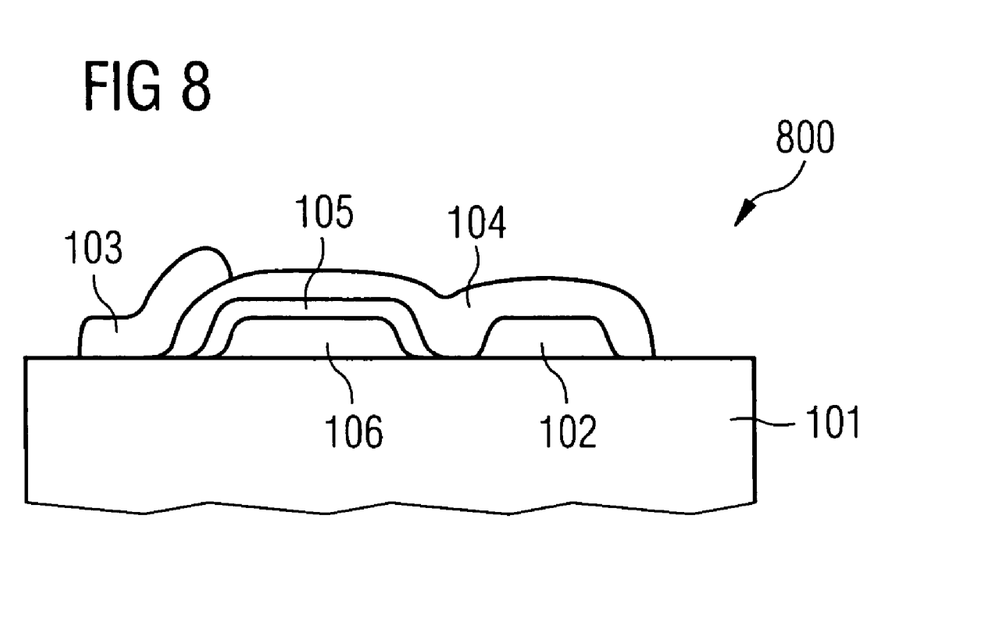
FIG. 8 shows a polymer transistor of a polymer transistor arrangement in accordance with a preferred exemplary embodiment of the invention.

As shown in FIG. 8, the junction regions between a respective one of the source/drain regions 102, 103, on the one hand, and the channel region 104, on the other hand, are formed geometrically asymmetrically with respect to one another. The second source/drain region 103 is formed partially on the channel region 104, and the first source/drain region 102 is essentially formed below the channel region 104. This asymmetrical arrangement of the two source/drain regions with respect to one another means that the junction regions between a respective one of the source/drain regions 102, 103 and the respectively adjoining part of the channel region 104, at least one of which junctions is operated as a diode according to the invention, have different structural properties. These structural properties lead to different functional-physical properties of the two junction regions. It is clearly the case when the two junctions are provided asymmetrically that it is possible technologically to support the situation in which the different junctions can be operated in a different functionality by application of different electrical potentials to the terminals of the polymer transistor. Thus, according to the invention, by way of example, one of the junctions may be embodied at sufficiently low impedance such that it hardly influences the current flow, and the other junction may be connected up as a conductive diode. This can be supported geometrically.

Figure 9:
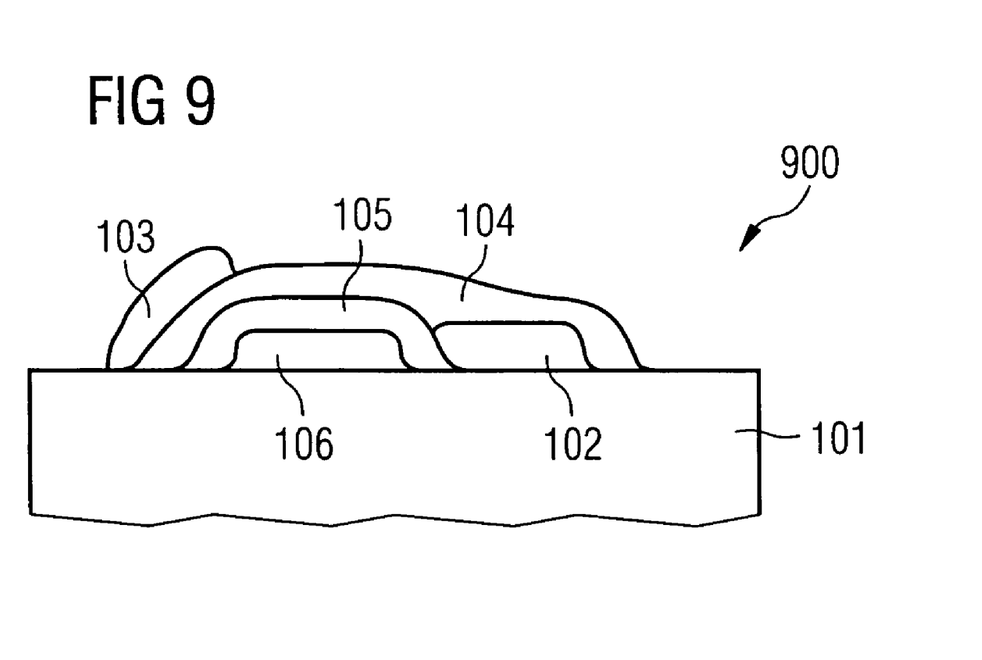
FIG. 9 shows a polymer transistor of a polymer transistor arrangement in accordance with another preferred exemplary embodiment of the invention.

A description is given below, with reference to FIG. 9, of a polymer transistor 900 of a polymer transistor arrangement according to the invention in accordance with another preferred exemplary embodiment of the invention.

A gate region 106 is formed on a substrate 101, which gate region is covered with a gate-insulating layer 105. A first source/drain region 102 is formed in a manner partially adjoining the gate-insulating layer 105 and partially on the substrate 101. The components formed are covered with semiconducting polymer material as channel region 104. A second source/drain region 103 is formed partially on the substrate 101 and partially on the channel region 104.

The polymer transistor arrangement 900 also has a pronounced geometrical asymmetry with regard to the two source/drain regions 102, 103. This again brings about a significant difference in the physical properties of the junctions between one of the source/drain regions 102, 103 and the channel region 104. As a result, it is possible to structurally support the invention's driving of these junctions as blocking or as conductive diodes.

The invention claimed is:

1. An electrical component, comprising:
a polymer transistor formed in and/or on a substrate including:
a first source/drain region;
a second source/drain region;
a channel region between the first and second source/drain regions;
a gate region; and
a gate-insulating layer between the channel region and a gate region; and a drive circuit set up to provide the first source/drain region with a voltage of sufficiently large magnitude and the gate region with a drain voltage of a sufficiently small magnitude, such that the polymer transistor has properties similar or identical to those of a Schottky diode.

2. The electrical component as claimed in claim 1, wherein the drive circuit provides the source/drain regions and the gate region with electrical potentials such that the junction between one of the two source/drain regions and the channel region is connected as a reverse-biased diode.

3. The electrical component as claimed in claim 1, wherein the channel region and the source/drain regions are produced from a material such that the junction between one of the source/drain regions and the channel region is one of a Schottky junction, an in junction, an ip junction, and a pn junction.

4. The electrical component as claimed in claim 1, wherein the drive circuit provides electrical potentials such that a magnitude of the gate voltage is greater than a magnitude of the voltage between the source/drain regions.

5. The electrical component as claimed in claim 1, wherein the junctions between respective ones of the source/drain regions and the channel region are formed geometrically asymmetrically with respect to one another.

6. The electrical component as claimed claim 1, wherein one of the source/drain regions is formed at least partially on the channel region and the other source/drain region is formed at least partially below the channel region.

7. An integrated circuit arrangement having the electrical component as claimed in claim 1.

8. The integrated circuit arrangement as claimed in claim 7, wherein the integrated circuit arrangement is a reference voltage circuit.

9. The integrated circuit arrangement as claimed in claim 7, wherein the integrated circuit arrangement is a temperature-compensated reference voltage circuit.

10. The integrated circuit arrangement as claimed in claim 7, wherein the integrated circuit arrangement is a current source.

11. The integrated circuit arrangement as claimed in claim 7, wherein the integrated circuit arrangement is a voltage control circuit.

12. A method for producing an electrical component, comprising the steps of:
    forming a polymer transistor in and/or on a substrate by:
        forming a first source/drain region;
        forming a second source/drain region;
        forming a channel region between the first and second source/drain regions;
        forming a gate region; and
        forming a gate-insulating layer between the channel region and the gate region; and
    setting up a drive circuit to provide the first source/drain region with a voltage of sufficiently large magnitude and the gate region with a drain voltage of a sufficiently small magnitude, such that the polymer transistor has properties similar or identical to those of a Schottky diode.

* * * * *